United States Patent
Chen et al.

(10) Patent No.: US 9,711,516 B2
(45) Date of Patent: Jul. 18, 2017

(54) NON-VOLATILE MEMORY HAVING A GATE-LAYERED TRIPLE WELL STRUCTURE

(71) Applicant: TAIWAN SEMICONDUCTOR MANUFACTURING COMPANY LTD., Hsinchu (TW)

(72) Inventors: Shih-Hsien Chen, Hsinchu County (TW); Hau-Yan Lu, Hsinchu (TW); Liang-Tai Kuo, Hsinchu County (TW); Chun-Yao Ko, Hsinchu (TW); Felix Ying-Kit Tsui, Cupertino, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/928,688

(22) Filed: Oct. 30, 2015

(65) Prior Publication Data

US 2017/0125425 A1    May 4, 2017

(51) Int. Cl.
*H01L 27/11* (2006.01)
*H01L 27/1156* (2017.01)
*H01L 27/11524* (2017.01)
*H01L 27/11558* (2017.01)

(52) U.S. Cl.
CPC .... *H01L 27/1156* (2013.01); *H01L 27/11524* (2013.01); *H01L 27/11558* (2013.01)

(58) Field of Classification Search
CPC .......... H01L 27/1156; H01L 27/11524; H01L 27/11558
See application file for complete search history.

(56) References Cited

U.S. PATENT DOCUMENTS

| | | | | |
|---|---|---|---|---|
| 4,322,822 A * | 3/1982 | McPherson | ............ | G11C 17/16 257/301 |
| 4,442,447 A * | 4/1984 | Ipri | ..................... | H01L 29/7883 257/315 |
| 4,448,400 A * | 5/1984 | Harari | .................... | G11C 11/565 257/262 |
| 5,455,790 A * | 10/1995 | Hart | ........................ | G11C 16/10 257/315 |
| 6,410,389 B1 * | 6/2002 | Cappelletti | ....... | H01L 27/11521 257/E21.422 |
| 6,590,247 B2 * | 7/2003 | Ghilardelli | .............. | H01L 29/94 257/296 |
| 7,095,094 B2 * | 8/2006 | Kerr | ..................... | H01L 21/8249 257/499 |
| 7,375,398 B2 * | 5/2008 | Wang | .................. | H01L 29/4916 257/213 |
| 7,452,771 B2 * | 11/2008 | Ito | ..................... | H01L 27/11521 257/E21.422 |

(Continued)

*Primary Examiner* — Ida M Soward
(74) *Attorney, Agent, or Firm* — WPAT, P.C., Intellectual Property Attorneys; Anthony King

(57) ABSTRACT

A non-volatile memory structure includes a semiconductor substrate and a first layer of a first dopant type in the semiconductor substrate. The non-volatile memory structure further includes a first well region of a second dopant type over the first layer, a second well region of the second dopant type over the first layer and spaced apart from the first well region, and a third well region of the first dopant type disposed between the first well region and the second well region and extending downward to the first layer.

20 Claims, 8 Drawing Sheets

(56) References Cited

U.S. PATENT DOCUMENTS

| | | | | |
|---|---|---|---|---|
| 7,626,225 | B2* | 12/2009 | Inoue | H01L 29/7883 257/314 |
| 7,671,401 | B2* | 3/2010 | Fang | G11C 16/0416 257/318 |
| 7,687,347 | B2* | 3/2010 | Shum | H01L 27/115 257/E21.598 |
| 8,450,808 | B1* | 5/2013 | Chung | H01L 21/82341 257/369 |
| 8,546,875 | B1* | 10/2013 | Hirler | H01L 23/481 257/330 |
| 8,587,045 | B2* | 11/2013 | Kwon | H01L 27/11519 257/296 |
| 8,836,026 | B2* | 9/2014 | Roehrer | H01L 29/0653 257/337 |
| 8,853,763 | B2* | 10/2014 | Pham | H01L 21/2815 257/314 |
| 8,987,797 | B2* | 3/2015 | Kwon | H01L 27/11519 257/296 |
| 9,231,078 | B2* | 1/2016 | Chung | H01L 29/66492 |
| 2001/0023969 | A1* | 9/2001 | Lustig | H01L 21/82384 257/402 |
| 2009/0290417 | A1* | 11/2009 | Park | G11C 16/0433 365/185.08 |
| 2014/0177338 | A1* | 6/2014 | Ching | G11C 16/0441 365/185.14 |
| 2014/0361358 | A1* | 12/2014 | Chen | H01L 27/11524 257/315 |
| 2015/0303208 | A1* | 10/2015 | Kim | H01L 27/11519 257/300 |
| 2016/0035421 | A1* | 2/2016 | Ching | H01L 29/7881 365/185.1 |

\* cited by examiner

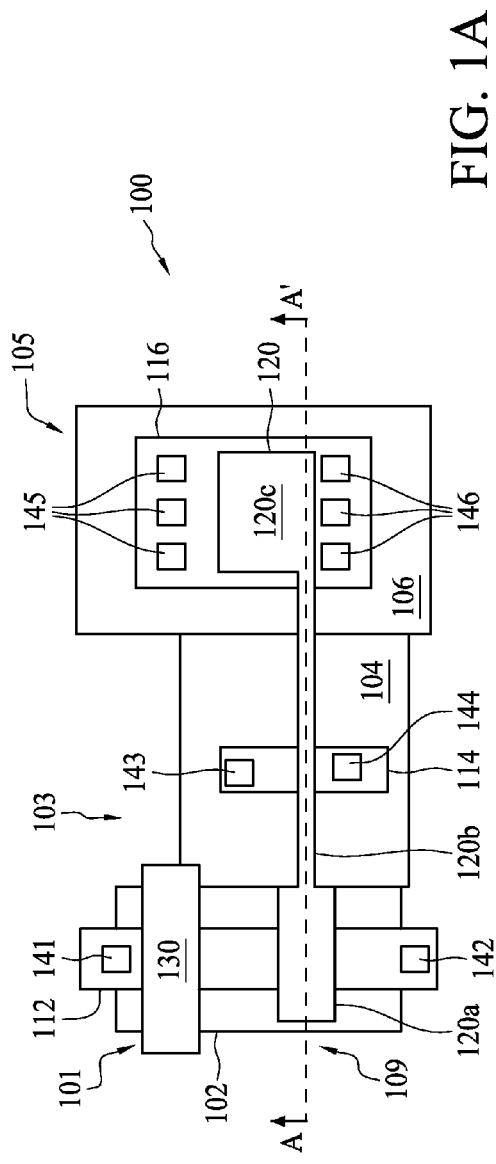
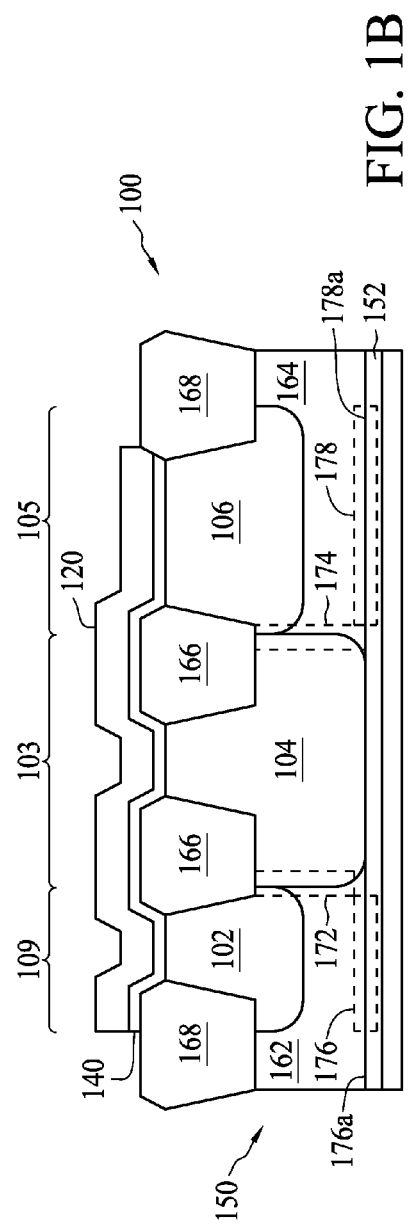
FIG. 1A
FIG. 1B

NON-VOLATILE MEMORY HAVING A GATE-LAYERED TRIPLE WELL STRUCTURE

BACKGROUND

Non-volatile memory is a type of memory that is capable of retaining embedded data when power is turned off. In addition, non-volatile memory has found many applications in the areas of data storage and electronic controllers. As the device size continues to shrink, the power consumption and manufacturing cost for the non-volatile memory are required to be decreased accordingly. Furthermore, integration of non-volatile memory with logic circuits within an efficient and economic framework is required as well. Hence, it may be desirable to improve the existing structure and manufacturing approach so as to address the above needs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A shows a schematic diagram of a non-volatile memory cell in accordance with some embodiments.

FIG. 1B shows a cross-sectional diagram of the non-volatile memory cell of FIG. 1A taken along a line AA', in accordance with some embodiments.

DETAILED DESCRIPTION

Figure 1C:
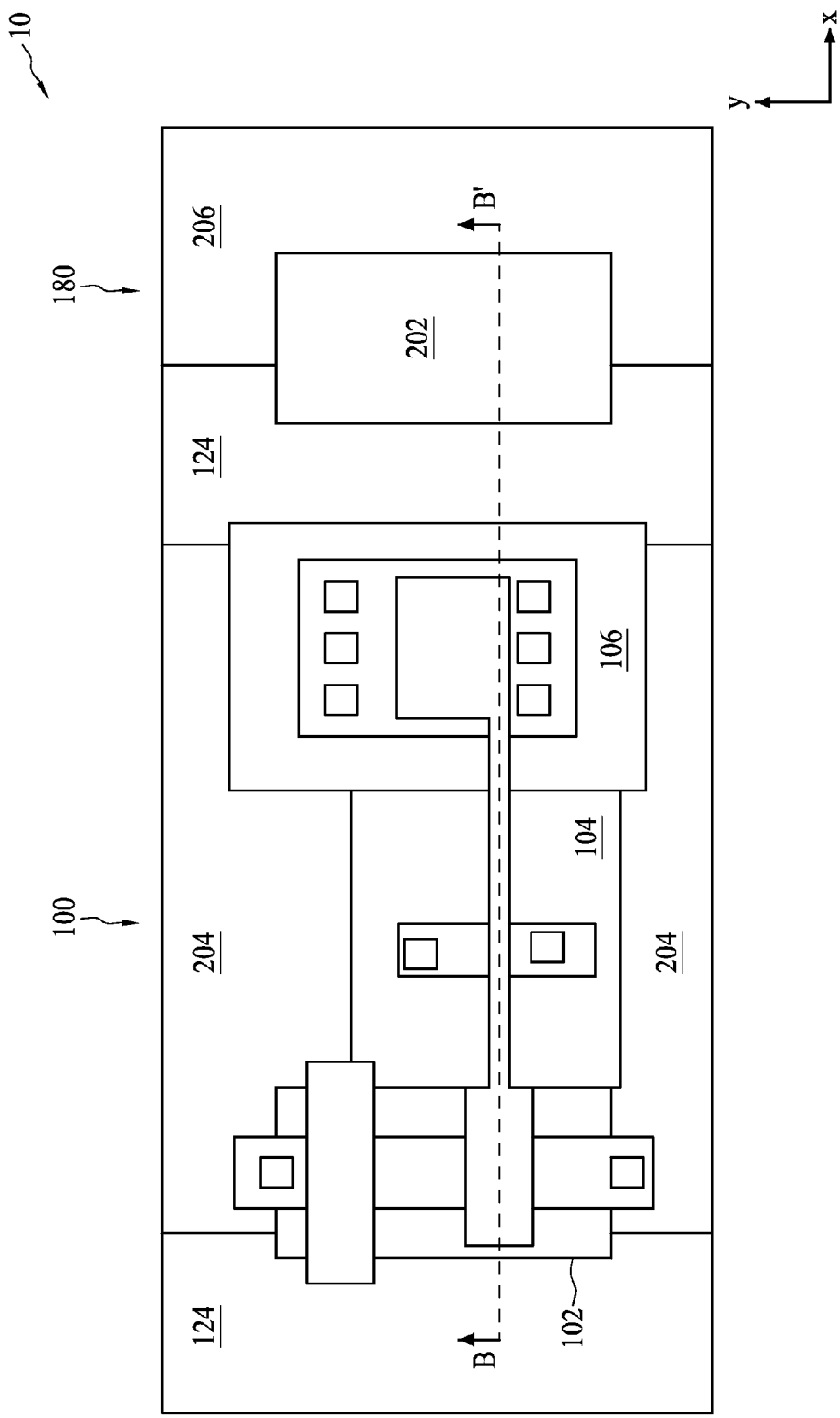
FIG. 1C is a top view of a non-volatile memory array in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Non-volatile memory comprises a dual gate structure where a floating gate is configured and charges used as data are provided or reduced therein by a write operation. In addition, a read operation is performed to detect current variation according to the charging status in the floating gate. In a write operation, the program or erase voltage is usually made high in order to provide driving capability for the charges. In designing and manufacturing memory cells, caution should be made to prevent undesired shorting or conducting paths in the memory cell for a write operation. Furthermore, the non-volatile memory cells are usually required to integrate with other logic circuits with a minimal number of manufacturing operations in order to save cost.

In the present disclosure, a non-volatile memory cell is discussed where potential current leakage is managed when a high write voltage is applied. Further, the memory cell is implemented concurrently with other logic circuits without incurring additional processing steps. As a result, the proposed memory cell structure is effective in leakage mitigation with a feasible integration framework.

FIG. 1A shows a schematic diagram of a non-volatile memory cell 100. The non-volatile memory cell 100 comprises a first transistor 101, a second transistor 109, a first capacitor 103 and a second capacitor 105. The second transistor 109 comprises a first gate 120a, which is a portion of an extended gate layer 120. Further, the extended gate layer 120 is a floating gate, shared by the second transistor 109, the first capacitor 103 and the second capacitor 105, and configured to store positive or negative charges as information data. In addition, the second transistor 109 comprises a second gate 130 configured to serve as a select gate and receive a select signal for enabling the first transistor 101. The floating gate 120 or the select gate 130 may include a conductive material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or a combination thereof.

The non-volatile memory cell 100 comprises a first active region 112 disposed in a first well region 102 and shared by the first transistor 101 and the second transistor 109. Also, the first gate region 120a of the second transistor 109 is disposed over the first active region 112. Thus, the first active region 112 is overlapped by both the first transistor 101 and the second transistor 109. The first transistor 101 or the second transistor 109 may be a P-channel transistor or an N-channel transistor dependent on the conductivity or dopant type of the first active region 112. In an embodiment, the first well region 102 is doped with a first dopant type, such as a P-type dopant of boron or BF2. In other embodiments, the first active region 112 is doped with a second dopant type such as an N-type dopant of phosphorus or arsenic. The first active region 112 comprises a source region, a drain region and a channel region therebetween. Additionally, the first active region 112 comprises contacts 141 and 142 formed thereon, preferably on the source region and the drain region, respectively. Furthermore, the channel region (not numbered) of the first active region 112 is positioned under the floating gate 120a in the first well region 102 between the drain/source regions of the first active region 112.

The first capacitor 103 is formed in a metal-oxide-semiconductor field effect transistor (MOSFET) structure and comprises a second active region 114 disposed in a second well region 104. In addition, the first capacitor 103 comprises second contacts 143 and 144 formed on the source and drain regions of the second active region 114. In addition, the first capacitor 103 comprises a second gate region 120b between the first gate region 120a and a third gate region 120c of the floating gate 120. In an embodiment, the second contacts 143 and 144 are electrically coupled by wiring or other connections to serve as an input of an erase gate of the non-volatile memory cell 100.

Similarly, the second capacitor 105 is formed in a MOSFET structure and comprises a third active region 116 disposed in a third well region 106. In addition, the second capacitor 105 also comprises third contacts 145 and 146 formed on the source and drain regions of the third active region 116. Furthermore, the second capacitor 105 comprises the third gate region 120c, which is a part of the floating gate 120. In an embodiment, the second contacts 145 and 146 are electrically coupled by wiring or other connections to serve as an input of a program gate of the non-volatile memory cell 100.

In an embodiment, the second well region 104 is doped with a dopant type different from that of the first well region 102. For example, the second well region 104 is doped with an N-type dopant. In another embodiment, the third well region 106 is doped with a same dopant type as that of the first well region 102, for example a P-type dopant. In some embodiments, for simplicity and clarity, some elements such as isolation regions not shown in FIG. 1A are illustrated in FIG. 1B.

FIG. 1B shows a cross-sectional diagram of the non-volatile memory cell 100 of FIG. 1A taken along a line AA', in accordance with some embodiments. Referring to FIGS. 1A and 1B, the non-volatile memory cell 100 comprises a semiconductor substrate 150, a first layer 152, a first doped region 162, a second doped region 164, isolation regions 166 and 168, and an insulation layer 140.

The semiconductor substrate 150 includes an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonite; or combinations thereof. In some embodiments, the semiconductor substrate 150 also includes a silicon-on-insulator (SOI) substrate. Some exemplary substrates include an insulator layer. The insulator layer includes any suitable material, including silicon oxide, sapphire, other suitable insulating materials, and/or combinations thereof.

The first layer 152 is disposed in the semiconductor substrate 150. In an embodiment, the first layer 152 is formed as a buried layer or a deep well region. Furthermore, the first layer 152 is configured to serve as an isolation layer such that noise resulting from different circuits disposed in other areas (not shown) may be blocked therefrom. Thus, the electrical performance of the non-volatile memory cell 100 may be better maintained. In an embodiment, the first layer 152 is doped with a different dopant type than the semiconductor substrate 150. For example, the first layer 152 is doped with an N-type dopant in a P-type semiconductor substrate 150. In addition, the first layer 152 is formed below the first well region 102, the second well region 104 or the third well region 106, thus resulting in a deep N-well.

The isolation regions 166 are configured to provide electrical isolation between the first active region 112 and the second active region 114, and between the second active region 114 and the third active region 116. Further, the non-volatile memory cell 100 also includes isolation regions 168 for electrical isolation from adjacent non-volatile memory cells. In an embodiment, the isolation regions 166 and 168 include shallow trench isolation (STI) structures. In an embodiment, the isolation regions 166 and 168 may be adjacent to the first active region 112, the second active region 114 or the third active region 116. Suitable materials for the isolation regions 166 and 168 include silicon oxide, silicon nitride, silicon oxynitride, an air gap or a combination thereof.

The insulation layer 140 is disposed between the floating gate 120 and each of the underlying first well region 102, the second well region 104 and the third well region 106. In some embodiments, the insulation layer 140 is not configured as a contiguous layer underneath the floating gate 120. For example, the insulation layer 140 may be disposed over the respective channel regions of the first transistor 101 and the second transistor 109. In some embodiments, the insulation layer 140 is disposed between the floating gate 120 and each of the first active region 112, the second active region 114 and the third active region 116.

An exemplary insulation layer 140 includes silicon oxide (e.g., thermal oxide or chemical oxide) and/or silicon oxynitride (SiON). The insulation layer 140 includes a dielectric material, such as silicon oxide, silicon nitride, silicon oxynitride, high-k dielectric material, other suitable dielectric material, and/or a combination thereof. Examples of high-k dielectric material includes HfO2, HfSiO, HfSiON, HfTaO, HfTiO, HfZrO, Zirconium oxide, aluminum oxide, hafnium dioxide-alumina (HfOZi-Al2O3) alloy, other suitable high-k dielectric materials, and/or a combination thereof.

The first capacitor 103 functions to store electric charges with two conductive plates spaced apart by the insulating layer 140, where the second gate region 120b serves as one plate and the second active region 114 serves as the other plate. Similarly, the second capacitor 105 functions to store electric charges with two conductive plates separated by the insulating layer 140, where the second gate region 120c serves as one plate and the third active region 116 serves as the other plate.

In the present embodiment, the second well region 104 is doped with a dopant type different from that in its neighboring well regions 102 and 106. In an embodiment, the second well region 104 is doped with an N-type dopant while the first well region 102 and the third well region 106 are doped with a P-type dopant. As a result, an interfacial p-n junction 172 is formed between the first well region 102 and the second well region 104. Similarly, an interfacial p-n junction 174 is formed between the second well region 104 and the third well region 106.

In some embodiments, the first doped region 162 and the second doped region 164 are configured as lightly-doped regions with P-type dopant. In some embodiments, the first doped region 162 and the second doped region 164 are filled with a same material as the semiconductor substrate 150. Furthermore, the second well region 104 and the first layer 152 are doped with the same type of dopant, such as an N-type dopant. Consequently, an interfacial p-n junction 176 is formed between the first doped region 162 and the first layer 152 along a surface 176a of the first layer 152. Similarly, an interfacial p-n junction 178 is formed between the second doped region 164 and the first layer 152 along a surface 178a of the first layer 152.

In an embodiment, the erase gate of the first capacitor 103 is applied with a positive voltage higher than that applied to the terminals of the first transistor 101, the second transistor 109 or the program gate of the second capacitor 105. As a result, the p-n junctions 172, 174, 176 and 178 are reverse-biased. The current flowing through the first capacitor 103 is refrained from passing across the p-n junctions 172, 174 176 and 178. Hence, given a normal operation requirement under the breakdown voltage such as 18 volts, undesirable current is substantially blocked from flowing from the second well region 104 into the first well region 102 or the third well region 106. The terminal potential of the first transistor 101, the second transistor 109 or the second capacitor 105 is thus not impacted or deviated by undesired leakage currents and can be kept stable. As a result, a normal write operation of the non-volatile memory cell 100 is maintained under such high erase voltage.

In some embodiments, the second well region 104 has a depth deeper than that of the first well region 102 or the third well region 106. Moreover, the second well region 104 extends downward to the first layer 152 so that at least a portion of the second well region 104 reaches the first layer 152. Hence, the first doped region 162 and the second doped region 164 are spaced apart from each other by the second well region 104. Furthermore, there is at least one p-n junction, such as the junction 172 or 174, disposed between the first doped region 162 and the second doped region 164.

Alternatively, the first well region 102 is covered from laterals thereof by regions with a different dopant type. Also, the third well region 106 is covered from laterals thereof by regions with a different dopant type. In that case, the first well region 102 or the third well region 106 is enclosed, in additional to the isolation regions 166 and 168, by either the second well region 104 or the first layer 152 through the first doped region 162 and the second doped region 164, respectively.

FIG. 1C is a top view of a non-volatile memory array 10 in accordance with some embodiments. Referring to FIG. 1C, the non-volatile memory cell array 10 comprises a plurality of non-volatile memory cells, for example, the memory cell 100 in FIG. 1A. The non-volatile memory array 10 further comprises another non-volatile memory cell 180 next to the non-volatile memory cell 100, whilst only a portion of the non-volatile memory cell 180 is shown in FIG. 1C. The non-volatile memory cells 100 and 180 are similar in structure and disposed in an array. In some embodiments, the non-volatile memory array 10 may comprise more non-volatile memory cells arranged along the x-axis or y-axis direction. In addition, the non-volatile memory cell 180 comprises an exemplary fourth well region 202 similar to the first well region 102 associated with the first transistor, second transistor, capacitor structure or well region.

As shown in FIG. 1C, the non-volatile memory cell 100 is flanked by a fifth well region 204 and sixth well regions 124. Further, the fifth well region 204 and the sixth well regions 124 surround the first well region 102, the second well region 104 and the third well region 106. In some embodiments, the fifth well region 204 and the sixth well regions 124 are doped with the same dopant type as the second well region 104. As discussed previously, the arrangement of two neighboring well regions with opposite dopant types would cause a p-n junction at the boundary of the two well regions. Accordingly, since the first well region 102 with a P-type dopant and the third well region 106 are contiguous with the N-type well regions 104 and 204, when the second well region 104 receives a high positive voltage and the first well region 102 and the third well region 106 are grounded, reverse-biased p-n junctions formed therebetween function to keep undesired leakage current from flowing into the first transistor 101 or the second transistor 109. The potentials of the terminals on the first transistor 101 or the second transistor 109 are thus kept undisturbed. Similarly, since the third well region 106 with the P-type dopant is contiguous with the N-type well regions 104 and 204, when the second well region 104 receives a high positive voltage and the third well region 106 is grounded, reverse-biased p-n junctions formed therebetween function to keep leakage current from flowing into the third well region 106. Therefore, the program gate voltage of the second capacitor 105 is kept undisturbed. In such reverse-bias conditions, the first transistor 101, the second transistor 109 and the second capacitor 105 are bounded and electrically isolated by the first capacitor 103 and the first layer 152.

In some embodiments, the fifth well region 204 and the sixth well regions 124 are regarded as extended parts of the second well region 104. Thus, the second well region 104 covers the laterals of the first well region 102 and the third well region 106. In other embodiments, also referring to FIGS. 1A and 1B, the isolation regions 166 may be configured to extend to encircle the first active region 112, the second active region 114 and the third active region 116. Similarly, the isolation regions 168 may be configured to extend to encircle the first active region 112 or the third active region 116. In that case, the fifth well region 204 may contact the first well region 102 or the third well region 106 below the isolation regions 166 or 168. Hence, the area of p-n junctions thus formed would be reduced with the downwardly extending isolation regions 166 and 168.

In an embodiment, the non-volatile memory array 10 comprises a seventh well region 206 surrounding a portion of the forth well region 202. In some embodiments, the seventh well region 206 is doped with the same dopant type as the fifth well region 204 or the sixth well region 124, for example an N-type dopant. As a consequence, the forth well region 202 is electrically isolated from the non-volatile memory cell 100 under reverse-biased voltages. With such arrangement for leakage current management, leakage current in the non-volatile memory array 10 may be controlled in a desired manner. Effectively, the erase operation with a high voltage applied to a certain memory cell would not impact the potentials on other terminals of the same memory cell or neighboring memory cells.

Figure 1D:
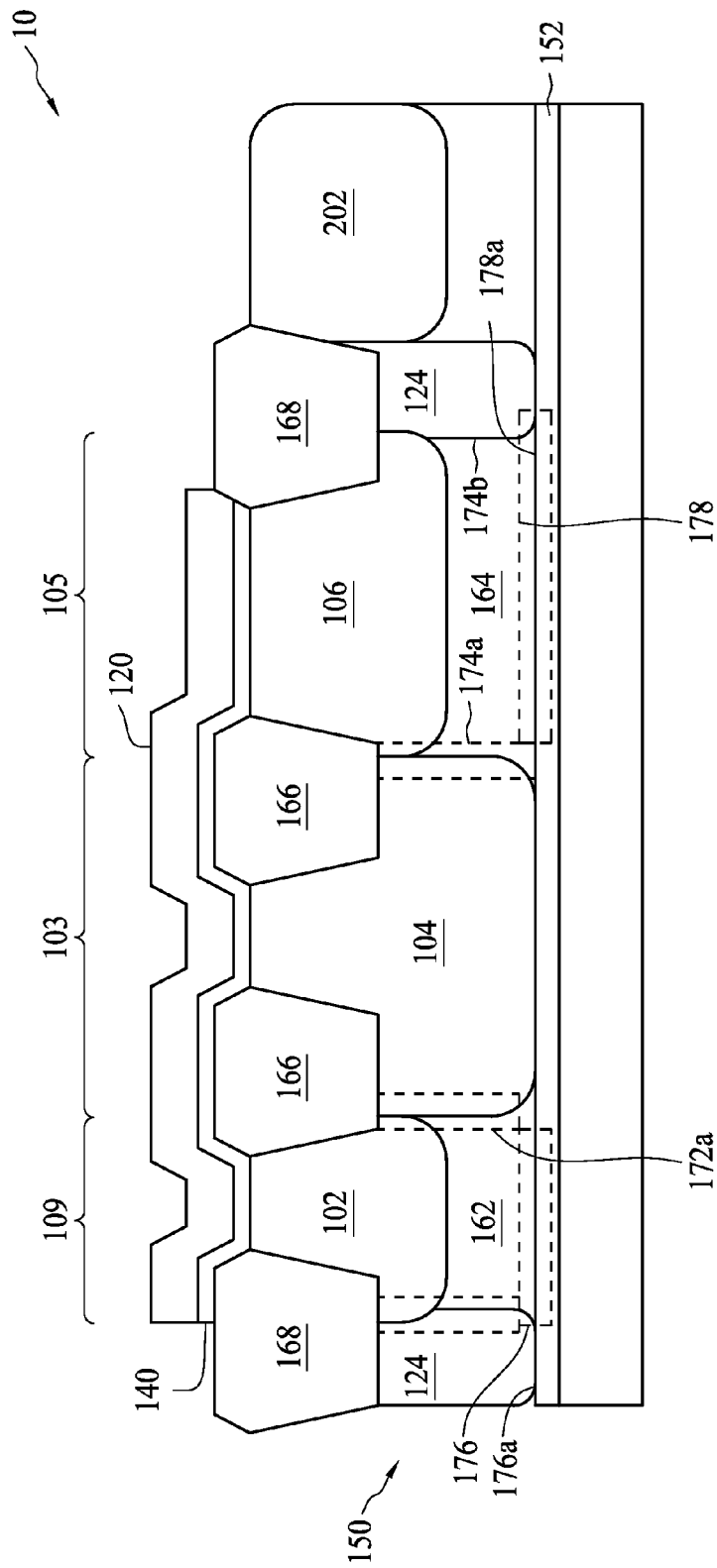
FIG. 1D shows a cross-sectional diagram of the non-volatile memory array of FIG. 1C taken along a line BB', in accordance with some embodiments.

FIG. 1D shows a cross-sectional diagram of the non-volatile memory array 10 of FIG. 1C taken along a line BB', in accordance with some embodiments. Referring to FIG. 1D, the sixth well regions 124 disposed at the outside periphery of the non-volatile memory cell 100 are extended to the first layer 152, similar to the case of the second well region 104. Moreover, a p-n junction 172a exists at the boundary between the P-type regions of the first well region 102 and the first doped region 162 and the N-type sixth well region 124, and a p-n junction 172b exists at the boundary between the P-type regions of the first well region 102 and the first doped region 162 and the N-type second well region 104. Furthermore, a p-n junction 176 exists at the boundary between the P-type first doped region 162 and the N-type first layer 152. As such, the first well region 102 and the first doped region 162 are substantially surrounded by the p-n junctions 172a, 172b and 176.

Likewise, a p-n junction 174a exists at the boundary between the P-type regions of the third well region 106 and the second doped region 164 and the N-type second well region 104, and a p-n junction 174b exists at the boundary between the P-type regions of the third well region 106 and the second doped region 164 and the N-type sixth well region 124. Furthermore, a p-n junction 178 exists at the boundary between the P-type second doped region 164 and the N-type first layer 152. As such, the third well region 106 and the second doped region 164 are substantially surrounded by the p-n junctions 174a, 174b and 178.

As discussed previously, p-n junctions appear at the boundary between P-type and N-type well regions. In an existing approach to address the current leakage problem for a non-volatile memory cell, an extra deep P-well may be configured between the first N-type buried layer and the overlying well region structures. As a consequence, the N-type well region would not be shorted to the underlying N-type buried layer with the help of the intervening deep P-well. However, although the current leakage can be managed, the manufacturing process for the deep P-well is not compatible with the current process flow of logic circuits since the deep P-type well is not always employed in logic circuit design. As a result, the manufacturing cost and production yield may not be desirable due to additional operations such as lithography mask, etching and implantation operations. By comparison, the proposed N-type well region 104 in conjunction with the N-type well regions 124 and the N-type first layer 152 solves the problem of current leakage without importing any extra current stopping layers. Hence, the advanced process flow applied to the logic devices can be seamlessly integrated with that for the non-volatile memory array. Effectively, manufacturing advantages such as improved process integration and reduced manufacturing cost and cycle, are achieved.

Figure 2A:
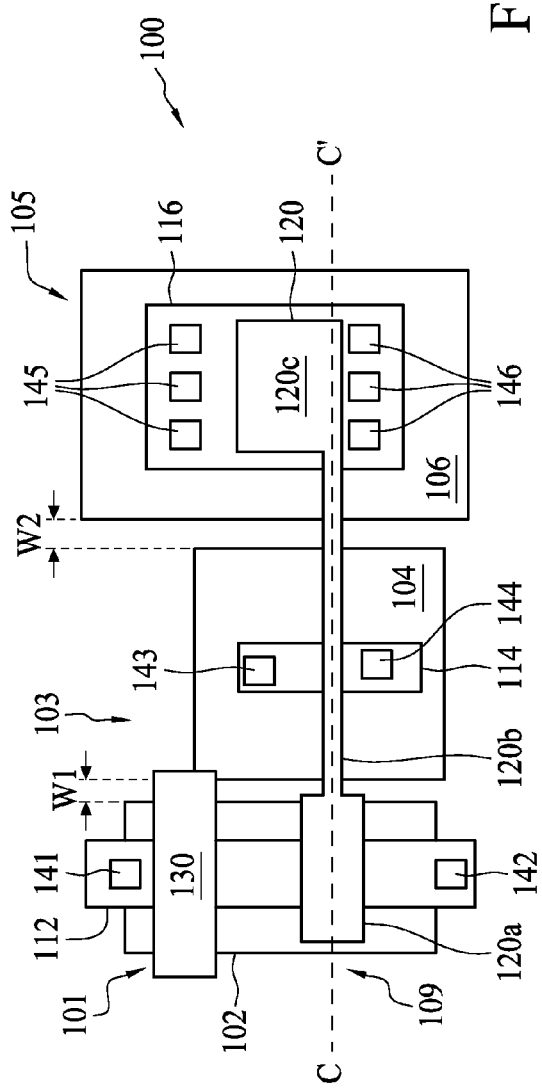
FIG. 2A shows a schematic diagram of a non-volatile memory cell in accordance with some embodiments.
Figure 2B:
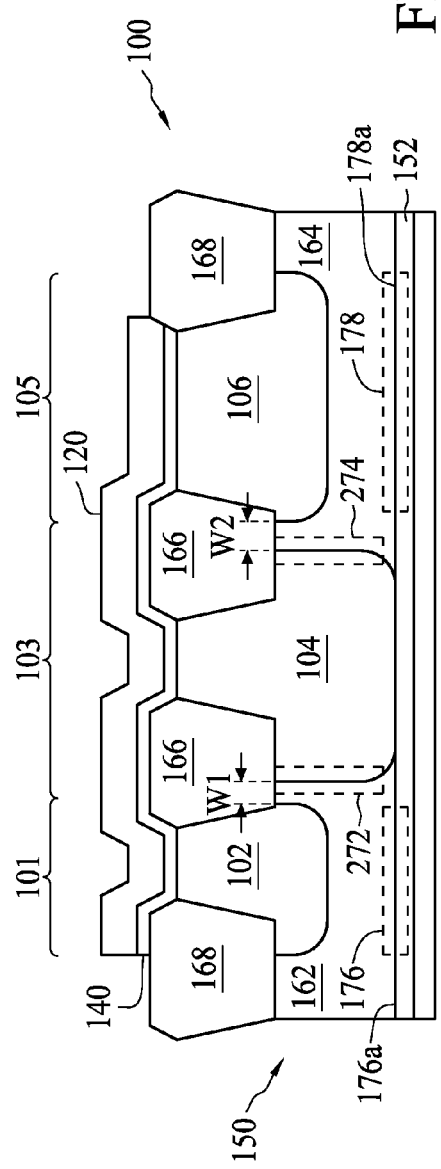
FIG. 2B shows a cross-sectional diagram of the non-volatile memory cell of FIG. 2A taken along a line CC', in accordance with some embodiments.

FIGS. 2A-2B shows schematic top-view and cross-sectional diagrams taken along a line CC' of a non-volatile memory cell 200, in accordance with some embodiments. Referring to FIGS. 2A and also 1A, the first well region 102 is spaced apart from the second well region 104 by a distance W1. Further, the third well region 106 is spaced apart from the second well region 104 by a distance W2. In some embodiments, the distance W1 is equal to the distance W2. In an embodiment, only one of the distance W1 and the distance W2 is reduced to zero, and thus only the first well region 102 or the third well region 106 is connected to the second well region 104.

Referring to FIGS. 2B and also 1B, a p-n junction 272 is formed between the first doped region 162 and the second well region 104. Similarly, a p-n junction 274 is formed between the first doped region 162 and the second well region 104. Therefore, the first well region 102 or the third well region 106 is isolated by the second well region 104 and the first layer 152 through the first doped region 162 or the second doped region 164, respectively. With such arrangement of p-n junctions 272 and 274, the breakdown voltage of the non-volatile memory cell 200 is made larger than that of the non-volatile memory cell 100 due to a larger gap between the second well region 104 and the first well region 102 or the third well region 106. Hence, a higher erase voltage is allowed.

Figure 3:
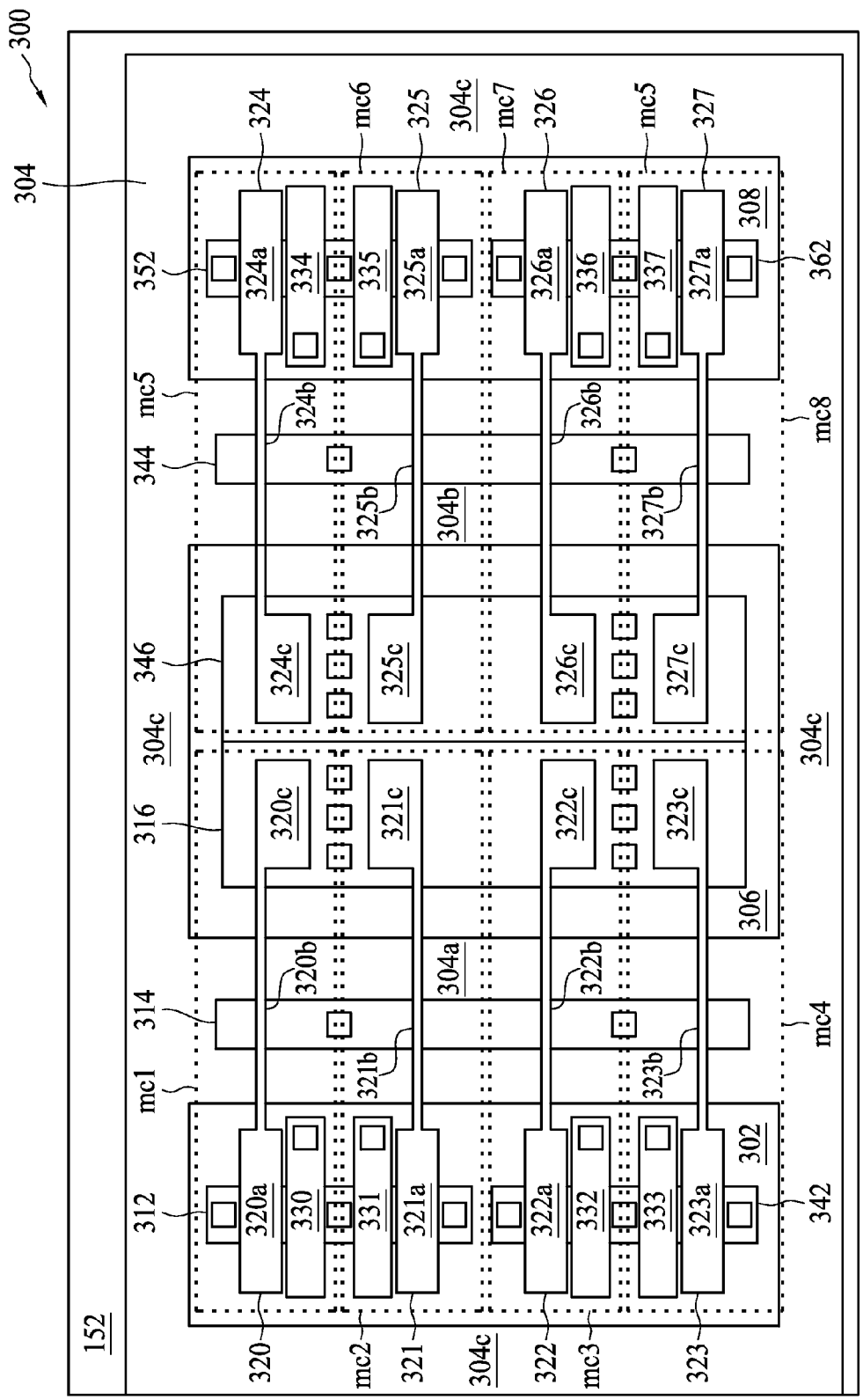
FIG. 3 is a top view of a non-volatile memory array in accordance with some embodiments.

FIG. 3 is a top view of a non-volatile memory array 300 in accordance with some embodiments. The non-volatile memory array 300 includes eight non-volatile memory cells mc1 through mc8, arranged in a 4×2 array, and each configured in a similar fashion to the non-volatile memory cell 100 of FIG. 1A. In addition, the non-volatile memory array 300 comprises first well regions 302, a second well region 304, a third well region 306 and a fourth well region 308. The second well region 304 is further partitioned into a sub-second well regions 304a disposed between the first well region 302 and the third well region 306, a sub-second well regions 30ba disposed between the third well region 306 and the fourth well region 308, and sub-second well regions 304c disposed on the peripherals of the non-volatile memory array 300. Furthermore, the non-volatile memory array 300 comprises four first active regions 312, 342, 352 and 362, two second active regions 314 and 344, and two third active regions 316 and 346. Moreover, the non-volatile memory array 300 comprises eight select gates 320 through 327 and eight floating gates 330 through 337.

The first active regions 312 and 342 are disposed on the first well region 302, and the first active regions 352 and 362 are disposed on the fourth well region 308. Also, the third active regions 316 and 346 are disposed on the third well region 306. Additionally, memory cells mc1, mc2, mc3 and mc4 are constructed on the first well region 302, the second well region 304a and the third well region 306. Similarly, memory cells mc5, mc6, mc7 and mc8 are constructed on the fourth well region 308, the second well region 304b and the third well region 306.

Among the eight non-volatile memory cells mc1 through mc8 in the non-volatile memory array 300, the first memory cell mc1 and the second memory cell mc2 share the first active region 312, the third memory cell mc3 and the fourth memory cell mc4 share the first active region 342, the fifth memory cell mc5 and the sixth memory cell mc6 share the first active region 352, and the seventh memory cell mc7 and the eighth memory cell mc8 share the first active region 362.

Each memory cell mc1 through mc8 comprises a first capacitor and a second capacitor. Referring to FIG. 3 and FIG. 1A, taking the first memory cell mc1 as an example, the first capacitor and the second capacitor comprise a gate region 320b a gate region 320c, respectively, as their first plates. In addition, memory cells mc1, mc2, mc3 and mc4 share the second active region 314 as a second plate of respective first capacitor in each memory cells mc1 through mc4. Also, memory cells mc1, mc2, mc3 and mc4 share the third active region 316 as a second plate of respective second capacitor in each memory cells mc1 through mc4. In a similar way, memory cells mc5, mc6, mc7 and mc8 share the second active region 344 as second plates for respective first capacitors thereof, and share the third active region 346 as second plates for respective second capacitors thereof.

The second well region 304 is disposed between the first well region 302 and the third well region 306 (shown with a portion 304a), and between the third well region 306 and the fourth well region 308 (shown with a portion 304b). Further, the second well region 304 surrounds the first well region 302, the third well region 306 and the fourth well region 308 from the laterals thereof. In an embodiment, the second well region 304 has an N-type dopant, and the first well region 302, the third well region 306 and the fourth well region have a P-type dopant. Thus, interfacial p-n junctions may be formed between the N-type well region and the P-type well regions.

Figure 4A:
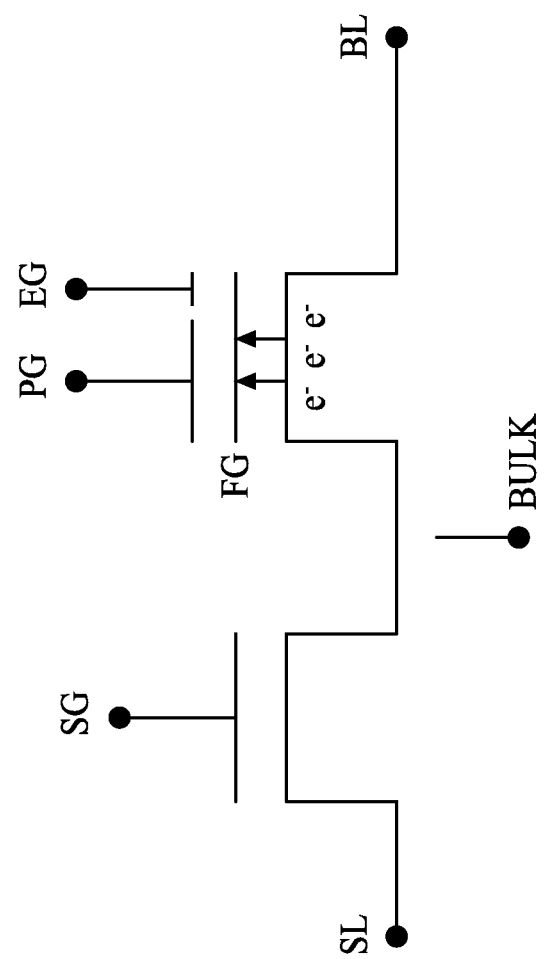
FIG. 4A is a schematic diagram for a program operation of the non-volatile memory cell in FIG. 1A, in accordance with some embodiments.

FIG. 4A is a schematic diagram for a program operation of the non-volatile memory cell 100 in FIG. 1A, in accordance with some embodiments. Referring to FIGS. 4A and also 1A and 1B, the non-volatile memory cell 100 comprises a select gate (SG) terminal coupled to the select gate 130, a source line (SL) coupled to the contact 141 of the source region for the first transistor 101 and a bit line (BL) connected to the contact 142 of the drain region for the first transistor 101. Further, a program gate (PG) terminal is connected to the contacts 145, 146 of the second capacitor 105, and an erase gate (EG) terminal is connected to the contacts 143, 144 of the first capacitor 103. In addition, a bulk (BULK) terminal is connected to the semiconductor substrate 150.

In the present disclosure, a program operation is to push the negative electrons into the floating gate 120 by electric fields. Moreover, an erase operation is to pull the negative electrons out of the floating gate 120 or push positive charges into the floating gate 120 in order to neutralize the negative electrons. However, it would be appreciated by any person skilled in the art that different definitions may be provided otherwise. A summarized table of a voltage setting for each terminal with the Fowler-Nordheim (FN) tunneling effect is given below.

TABLE 1

Memory cell voltage setting with FN tunneling effect

| Operation | $V_{SG}$ | $V_{PG}$ | $V_{EG}$ | $V_{BL}$ | $V_{SL}$ | $V_{Bulk}$ |
|---|---|---|---|---|---|---|
| Program | 0 | HV | HV | 0 | 0 | 0 |
| Erase | 0 | 0 | HV | 0 | 0 | 0 |
| Read | V1 | V2 | 0 | V3 | 0 | 0 |

In a program operation of the non-volatile memory cell 100, as shown in table 1, the program gate PG and the erase gate EG are supplied with a predetermined program voltage level HV, while the remaining terminals are kept grounded. At the same time, the bit line voltages for other non-selected memory cells are supplied with a predetermined voltage level approximately $V_{BLN}=HV/2$ so as to maintain proper operations of the selected memory cells as well as other unselected memory cells. When the voltage level HV applied to the first capacitor 103 and the second capacitor 105 is sufficiently high, the FN tunneling effect is caused to occur such that negative electrons are tunneled through the insulating layer 140 and into the floating gate 120. In addition, the program voltage level HV is required to be large enough for inducing an electric field that enables the FN tunneling effect. For example, the typical electric field intensity is at least approximately 10 MV/cm. Furthermore, the program voltage level HV is related to the thickness of the isolation layer 140. A thicker isolation layer 140 would correspond to a higher program voltage level HV. In an embodiment, the program voltage is between about 10 volts and about 20 volts, such as about 16 volts if the isolation layer 140 is designed for logic devices operated at about 5~6 volts. In other embodiments, the program voltage is between about 5 volts and about 10 volts, such as about 7 volts if the isolation layer 140 is designed for logic devices operated at about 2.5~3.3 volts.

Figure 4B:
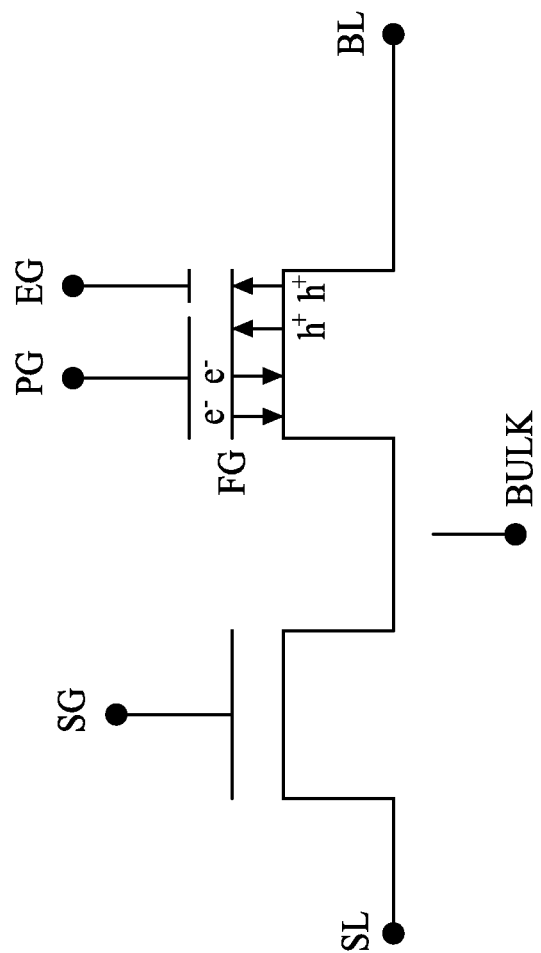
FIG. 4B is a schematic diagram for an erase operation of the non-volatile memory cell, in accordance with some embodiments.
Figure 5:
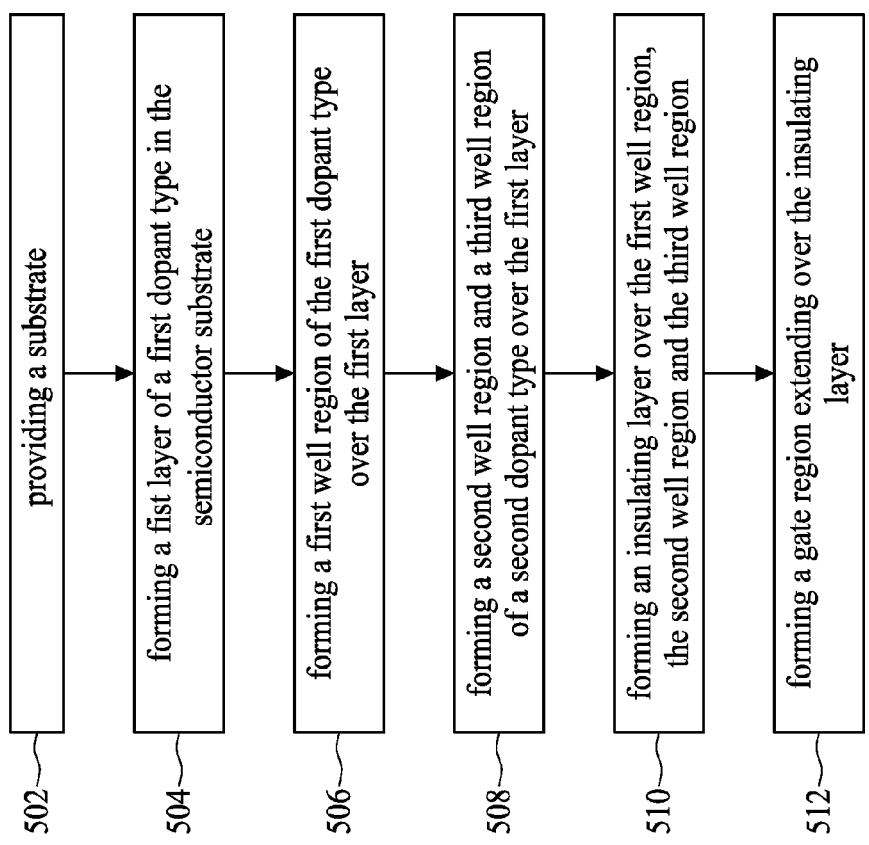
FIG. 5 shows a flow diagram of manufacturing a non-volatile memory cell in accordance with some embodiments.

FIG. 4B is a schematic diagram for an erase operation of the non-volatile memory cell 100, in accordance with some embodiments. In an erase operation, as shown in table 1, the erase gate EG alone is supplied with the predetermined voltage level HV, while the remaining terminals, including the program gate PG, are kept grounded. Hence, the voltage level HV $V_{EG}$ as applied to the first capacitor 103 produces a large voltage drop, causing the FN tunneling effect to occur accordingly such that negative electrons are tunneled out of the floating gate 120. Alternatively, positive charges are tunneled into the floating gate 120. Thus, the quantity of the net charges is effectively reduced.

As discussed previously, the erase gate EG is coupled to the underlying N-type second well region 104 through the first capacitor 103. Furthermore, the second well region 104 extends to the first layer 152. In an erasing operation, the positive voltage gap HV produces reverse-biased p-n junctions along the boundary between the N-type second well region 104 and the first layer 152, and the P-type well regions 102 and 106. The current is thus restricted to the area within the second well region 104 and the first layer 152. Hence, the leakage current issue is managed effectively with the erase gate voltage HV under the breakdown voltages of the junctions.

In a read operation, the terminals of the non-volatile memory cell 100 are determined in accordance with table 1. The first transistor 101 is turned on and configured to sense a current value in the channel region thereof. The predetermined voltage for the select gate $V_{SG}=V1$ is dependent upon the transistor performance and speed requirement. In an embodiment, it is determined that the select gate voltage V1 is set as the operational supply voltage (VDD), such as 2.5, 3.3 or 5 volts. Also, the voltages applied to the program gate PG and the bit line BL, i.e., $V_{PG}=V2$ and $V_{BL}=V3$, respectively, are predetermined so as to ensure proper function of the read operation. In some embodiments, it is determined that the program gate voltage V2 is between about 0 volts and about VDD of the non-volatile memory cell 100. Additionally, in some embodiments, the bit line voltage $V_{BL}=V3$ is determined as about 1 volt. The remaining terminals are grounded.

In some embodiments, the non-volatile memory cell 100 can be configured to operate in an alternative setting such as the channel hot electron (CHE) effect. Different from the FN tunneling effect, when the CHE effect is leveraged, the carriers flowing through the channel region of the MOS transistor are pulled in or pulled out of the floating gate 120. In addition, the applied voltages for a read operation with the CHE effect are similar to that with the FN tunneling effect. The following table 2 summarizes an alternative operational voltage setting for the terminals of the non-volatile memory cell 100.

TABLE 2

Alternative memory cell voltage setting

| Operation | $V_{SG}$ | $V_{PG}$ | $V_{EG}$ | $V_{BL}$ | $V_{SL}$ | $V_{Bulk}$ |
|---|---|---|---|---|---|---|
| Program | V4 | V5 | V5 | V6 | 0 | 0 |
| Erase | 0 | 0 | 0 | V7 | 0 | 0 |

In a program operation, as shown in table 2, the first transistor 101 is turned on with the voltages $V_{SG}$ and $V_{BL}$ determined as V4 and V6, respectively. Further, the voltage V4 is determined as the operational supply voltage (VDD) of the non-volatile memory cell 100, such as 2.5, 3.3 or 5 volts. Additionally, the drain voltage $V_{BL}=V6$ and the program gate (PG) and erase gate (EG) voltages are determined between 4 and 7 volts depending upon the cell characteristics, such as the current value and cell speed. The remaining terminals are kept grounded. As a consequence, a channel current is induced. Also, hot electrons in the channel region are injected into the floating gate 120 and stored therein.

In an erase operation, as shown in table 2, the bit line terminal BL alone is supplied with a predetermined voltage level $V_{BL}=V7$ while the remaining terminals are kept grounded. The bit line voltage V7 is determined as a largest level below the breakdown voltage of the junction. Hence, a band-to-band hot hole injection effect is induced such that positive charges are tunneled into of the floating gate 120. Thus, the quantity of the net charges is effectively reduced due to charge neutralization.

FIG. 4 shows a flow diagram of manufacturing a non-volatile memory cell in accordance with some embodiments. In operation 502, a semiconductor substrate is provided. In an embodiment, the semiconductor substrate is of a P-type.

In operation 504, a first layer of the first dopant type is formed in the semiconductor substrate. In an embodiment, the first dopant type is an N-type. The first layer is processed by any suitable process, such as implantation.

Then, in operation 506, a first well region of the first dopant type is formed over and near the first layer, thus resulting in a deep N-well. In an embodiment, the first well is extended downwardly to the first layer. In another embodiment, the semiconductor substrate is isolated into at least two portions by the first well region and the first layer. The first well region is formed by a suitable process, such as ion implantation with implantation dose of about $5 \times 10^{13}/cm^2$. In an embodiment, the first well region has a first doping concentration higher than a second doping concentration of the first layer.

In operation 508, a second well region and a third well region both composed of a second dopant type, such as a P-type, are formed over the first layer. The second well region and the third well region are formed with a depth less than that of the first well region. In some embodiments, a bottom portion of the second well region or a bottom portion of the third well region is spaced apart from the first layer by a gap filled with the semiconductor substrate. In an embodiment, the second well region or the third well region is formed with an ion implantation dose of, for example, about $2 \times 10^{13}/cm^2$.

In operation 510, an insulating layer is formed over the first well region, the second well region and the third well region. The insulating layer may be formed by a suitable process, such as deposition. The insulating layer is made of dielectric materials, such as silicon oxide, silicon nitride and silicon oxynitride.

In operation 512, a gate region extending over the insulating layer is formed.

In some embodiments, a non-volatile memory structure comprises a semiconductor substrate and a first layer of a first dopant type in the semiconductor substrate. The non-volatile memory structure further comprises a first well region of a second dopant type over the first layer, a second well region of the first dopant type and a third well region of the second dopant type over the first layer and spaced apart from the first well region. The second well region is disposed between the first well region and the third well region and extends downward to the first layer. The non-volatile memory structure further comprises a first gate layer extending over the first well region, the second well region and the third well region.

In some embodiments, a non-volatile memory cell is provided. The non-volatile memory cell comprises a semiconductor substrate and a first layer of a first dopant type in the substrate. The non-volatile memory cell further comprises a first transistor on a first well region of a second dopant type, a first capacitor on a second well region of the first dopant type, and a second capacitor on a third well region of the second dopant type. The first well region and the third well region are surrounded by the second well region and the first layer.

In some embodiments, a method of manufacturing a non-volatile memory cell is provided. The method includes: providing a semiconductor substrate; forming a first layer of a first dopant type in the semiconductor substrate; forming a first well region of the first dopant type over the first layer and extending to the first layer; and forming a second well region and a third well region of a second dopant type over the first layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A non-volatile memory structure, comprising:
a semiconductor substrate;
a first layer of a first dopant type in the semiconductor substrate;
a first well region of a second dopant type over the first layer;
a second well region of the first dopant type;
a third well region of the second dopant type over the first layer and spaced apart from the first well region, the second well region being disposed between the first well region and the third well region and extending downward to the first layer;
a first gate layer extending over the first well region, the second well region and the third well region; and
a first doped region disposed between the first well region and the second well region, the first doped region being of the second dopant type.

2. The non-volatile memory structure of claim 1, wherein the first dopant type is an N-type and the second dopant type is a P-type.

3. The non-volatile memory structure of claim 1, further comprising a second doped region of the second dopant type, the second doping region being disposed between the second well region and the third well region.

4. The non-volatile memory structure of claim 1, wherein the first well region and the third well region are isolated by the second well region and the first layer.

5. The non-volatile memory structure of claim 1, wherein the second well region covers laterals of the first well region and the third well region.

6. The non-volatile memory structure of claim 1, further comprising an insulating region between the first gate layer and the first well region, the second well region and the third well region.

7. The non-volatile memory structure of claim 1, further comprising a transistor comprising a second gate and a first active region in the first well region, the first active region having a first source region and a first drain region and being overlapped with the first gate layer and the second gate.

8. The non-volatile memory structure of claim 7, further comprising a second active region in the second well region, the second active region being overlapped with the first gate layer and comprising a second source region and a second drain region electrically coupled to the second source region.

9. The non-volatile memory structure of claim 8, further comprising a third active region in the third well region, the third active region being overlapped with the first gate layer and comprising a third source region and a third drain region electrically coupled to the third source region.

10. The non-volatile memory structure of claim 9, wherein in an erase operation for the non-volatile memory structure, the second active region is applied with a voltage level of from about 10 volts to about 20 volts, and the first active region and the third active region are grounded.

11. A non-volatile memory cell, comprising:
a semiconductor substrate;
a first layer of a first dopant type in the substrate;
a first transistor on a first well region of a second dopant type;
a first capacitor on a second well region of the first dopant type; and
a second capacitor on a third well region of the second dopant type, the first well region and the third well region being surrounded by the second well region and the first layer.

12. The non-volatile memory cell of claim 11, wherein the first dopant type is an N-type and the second dopant type is a P-type.

13. The non-volatile memory cell of claim 11, wherein the second well region extends to the first layer.

14. The non-volatile memory cell of claim 11, further comprising a fourth well region of the first dopant type, configured to surround the first well region, the second well region and the third region.

15. The non-volatile memory cell of claim 11, further comprising a first doped region and a second doped region both of the second dopant type, wherein the first well region forms a first p-n junction at a first boundary with the first well region and a second p-n junction at a second boundary with the first layer through the first doped region, and the third well region forms a third p-n junction with the second well region and a fourth p-n junction at a fourth boundary with the first layer through the second doped region.

16. The non-volatile memory cell of claim 11, further comprising a second transistor, wherein the first transistor comprises a first gate layer and a first active region in the first well region, the second transistor comprises a second gate, and the first active region is overlapped with the first gate layer and the second gate.

17. The non-volatile memory cell of claim 16, wherein each of the first capacitor and the second capacitor comprises two plates, the first gate layer being one plate for the first capacitor and one plate for the second capacitor.

18. A non-volatile memory structure, comprising:
a semiconductor substrate;
a first layer of a first dopant type in the semiconductor substrate;
a first well region of a second dopant type, opposite to the first dopant type, over the first layer;
a second well region of the first dopant type over the first layer;
a third well region of the second dopant type over the first layer, the first well region and the third well region being electrically isolated by the second well and the first layer;
a first gate layer extending over the first well region, the second well region and the third well region;
a first doped region disposed between the first layer and the first well region; and
a second doped region disposed between the first layer and the third well region, the first doped region and the second doped region being of the second dopant type.

19. The non-volatile memory structure of claim 18, wherein the first well region and the second well region are separated by the first doped region, and the second well region and the third well region are separated by the second doped region.

20. The non-volatile memory structure of claim 18, wherein
the first well region and the second well region are isolated by the first doped region; and
the third well region and the second well region are isolated by the second doped region.

* * * * *